(12) United States Patent
Kitano et al.

(10) Patent No.: US 10,240,726 B2
(45) Date of Patent: Mar. 26, 2019

(54) LUMINAIRE AND METHOD OF MANUFACTURING LUMINAIRE

(71) Applicant: PANASONIC INTELLECTUAL PROPERTY MANAGEMENT CO., LTD., Osaka (JP)

(72) Inventors: Hiroshi Kitano, Hyogo (JP); Hideharu Kawachi, Hyogo (JP); Shintaro Hayashi, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/682,706

(22) Filed: Aug. 22, 2017

(65) Prior Publication Data

US 2018/0058643 A1 Mar. 1, 2018

(30) Foreign Application Priority Data

Aug. 30, 2016 (JP) .................................. 2016-168578

(51) Int. Cl.
*F21K 2/06* (2006.01)
*F21K 9/64* (2016.01)
(Continued)

(52) U.S. Cl.
CPC ................. *F21K 9/64* (2016.08); *F21K 9/90* (2013.01); *H01S 5/005* (2013.01); *H01S 5/0014* (2013.01);
(Continued)

(58) Field of Classification Search
CPC ... F21K 9/64; F21K 9/90; H01S 5/005; H01S 5/02284; H01S 5/4012; F21V 9/35
(Continued)

(56) References Cited

U.S. PATENT DOCUMENTS

2009/0251883 A1* 10/2009 Yamasaki .............. B82Y 20/00
362/84
2012/0116159 A1* 5/2012 Mizuyoshi ........... A61B 1/0653
600/109

(Continued)

FOREIGN PATENT DOCUMENTS

JP 2014-011034 1/2014

*Primary Examiner* — Paultep Savusdiphol
(74) *Attorney, Agent, or Firm* — Greenblum & Bernstein, P.L.C.

(57) ABSTRACT

A luminaire including a wavelength converter and a method of manufacturing the luminaire are provided. The wavelength converter radiates, based on a laser light beam, a light beam having a wavelength different from the laser light beam. The method of measuring the luminaire includes measuring wavelengths of laser light beams oscillated by a plurality of laser elements to identify main wavelengths of the plurality of laser elements, storing association information between main wavelength information items indicating the main wavelengths identified and element information items identifying the plurality of laser elements corresponding to the main wavelengths identified, selecting a combination of laser elements having a composite wavelength falling within a predetermined range, from the plurality of laser elements, based on the association information, and arranging optical paths to irradiate a same area of the wavelength converter with the laser light beams of the combination of laser elements selected.

7 Claims, 8 Drawing Sheets

(51) Int. Cl.
  *F21K 9/90* (2016.01)
  *H01S 5/00* (2006.01)
  F21Y 115/30 (2016.01)
  F21V 9/35 (2018.01)
  H01S 5/022 (2006.01)
  H01S 5/323 (2006.01)
  H01S 5/40 (2006.01)

(52) U.S. Cl.
  CPC .............. *F21V 9/35* (2018.02); *F21Y 2115/30* (2016.08); *H01S 5/02284* (2013.01); *H01S 5/32341* (2013.01); *H01S 5/4012* (2013.01); *H01S 5/4087* (2013.01)

(58) Field of Classification Search
  USPC .......................................... 362/84, 259, 293
  See application file for complete search history.

(56) References Cited

U.S. PATENT DOCUMENTS

| | | | |
|---|---|---|---|
| 2014/0022810 A1* | 1/2014 | Ito ...................... | G01N 21/8806 |
| | | | 362/551 |
| 2014/0204558 A1* | 7/2014 | Bartlett ................ | G02B 26/008 |
| | | | 362/84 |
| 2015/0062955 A1* | 3/2015 | Sorg ......................... | F21K 9/56 |
| | | | 362/553 |
| 2016/0091784 A1* | 3/2016 | Hu ..................... | G03B 21/2013 |
| | | | 353/102 |
| 2016/0165194 A1* | 6/2016 | Hartwig ............... | G02B 26/008 |
| | | | 353/31 |

\* cited by examiner

FIG. 6

| ELEMENT INFORMATION (ID) | MAIN WAVELENGTH (nm) |
|---|---|
| 001 | 448.3 |
| 002 | 450.9 |
| ⋮ | ⋮ |
| 038 | 458.2 |
| 039 | 451.3 |
| 040 | 451.0 |
| ⋮ | ⋮ |
| 072 | 458.3 |
| 073 | 448.4 |
| 074 | 462.8 |
| 075 | 462.4 |
| 076 | 458.0 |
| ⋮ | ⋮ |

LUMINAIRE AND METHOD OF MANUFACTURING LUMINAIRE

CROSS REFERENCE TO RELATED APPLICATION

This application claims the benefit of priority of Japanese Patent Application Number 2016-168578 filed on Aug. 30, 2016, the entire content of which is hereby incorporated by reference.

BACKGROUND

1. Technical Field

The present disclosure relates to a method of manufacturing a luminaire having laser light as a source of light and to the luminaire.

2. Description of the Related Art

There are conventionally known luminaires which illuminate by causing phosphor dispersed in a wavelength converter to emit light using laser light as excitation light, to thereby convert the laser light into visible light of a desired color such as white light. In order to enhance light emission brightness in such a luminaire, a single wavelength converter is overlappingly irradiated with laser light beams outputted from a plurality of laser diodes (for example, see Japanese Unexamined Patent Application Publication No. 2014-11034 (Patent Literature 1)).

SUMMARY

In the case of a luminaire which causes a wavelength converter to emit light with laser light as excitation light, there are instances where, even when the same type of luminaires are used, luminous color is different due to individual difference. With regard to such individual difference in luminous color of the luminaires, since the wavelength width of laser light radiated from laser diodes is narrow compared to LEDs, etc., a slight variation in the main wavelength of laser light due to the individual difference between the laser diodes included by the respective luminaires has a strong impact on the luminous color of the luminaires. Therefore, suppressing variation of luminous color (color temperature) and manufacturing a stable luminaire is problematic.

The present disclosure provides a method of manufacturing a luminaire having laser light as a light source and in which variation of luminous color between products is minimal, and the luminaire.

A method of manufacturing a luminaire according to an aspect of the present disclosure is a method of manufacturing a luminaire including a wavelength converter that radiates, based on a laser light beam oscillated by a laser element, a light beam having a wavelength different from a wavelength of the laser light beam, the method including: measuring wavelengths of a plurality of laser light beams oscillated by a plurality of laser elements to identify main wavelengths of the plurality of laser elements; storing first association information indicating association between main wavelength information and element information, the main wavelength information indicating the main wavelengths identified, the element information identifying the plurality of laser elements corresponding to the main wavelengths identified; selecting, from the plurality of laser elements and based on the first association information, a combination of laser elements having a composite wavelength falling within a predetermined first range; and arranging optical paths to irradiate a same area of the wavelength converter with laser light beams of the combination of laser elements selected.

According to the present disclosure, it is possible to manufacture a luminaire which has laser light as a light source and has reduced individual difference-caused luminous color variation, and to provide such a luminaire.

BRIEF DESCRIPTION OF DRAWINGS

The figures depict one or more implementations in accordance with the present teaching, by way of examples only, not by way of limitations. In the figures, like reference numerals refer to the same or similar elements.

FIG. 6 is a table illustrating a stored state of associated element information and main wavelengths;

DETAILED DESCRIPTION

Hereinafter, a method of manufacturing a luminaire and the luminaire according to an exemplary embodiment of the present disclosure will be described with reference to the drawings. It should be noted that each of the subsequently-described exemplary embodiment and the variations thereof shows a specific example. Therefore, numerical values, shapes, materials, structural components, the arrangement and connection of the structural components, etc. shown in the following exemplary embodiment and variations thereof are mere examples, and are not intended to limit the scope of the present disclosure. Furthermore, among the structural components in the following exemplary embodiment and variations thereof, components not recited in any one of the independent claims which indicate the broadest concepts of the present invention are described as arbitrary structural components.

Furthermore, the respective figures are schematic diagrams and are not necessarily precise illustrations. Furthermore, in the respective figures, identical structural components are assigned the same reference sign and overlapping description thereof may be omitted.

[Luminaire Configuration Outline]

Figure 1:
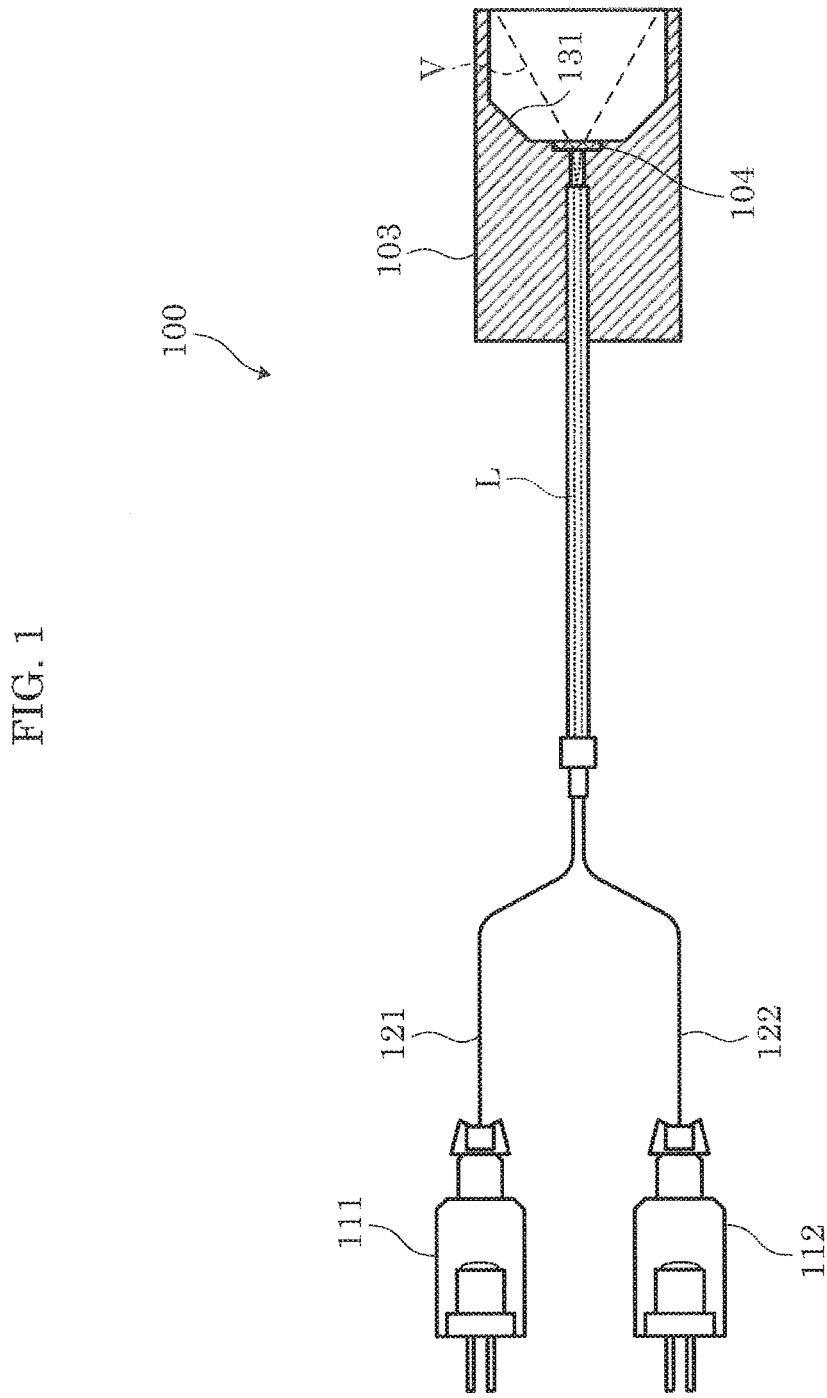
FIG. 1 is a diagram illustrating an outline of a luminaire according to an exemplary embodiment.

FIG. 1 is a diagram illustrating an outline of a luminaire according to an embodiment.

Luminaire 100 illustrated in the figure is an apparatus in which the same area of wavelength converter 104 is irradiated with laser light beams L oscillated by a plurality of laser elements to radiate a visible light V including light of a wavelength different from laser light beams L, and is for example an apparatus for illuminating a predetermined area indoors or outdoors. Luminaire 100 includes laser elements (first laser element 111 and second laser element 112), light guides (first light guide 121 and second light guide 122), base 103, and wavelength converter 104.

In this embodiment, luminaire 100 is a transmission type fixture in which one surface of wavelength converter 104 is irradiated with laser light beams L and white light is radiated from the surface on the opposite side. Specifically, the white light is radiated by way of the mixing of part of laser light beams L that have diffused and the light radiated from wavelength converter 104 which has a wavelength different from laser light beams L.

The laser elements including first laser element 111 and second laser element 112 are laser elements including what are called laser diodes which use recombination and light generation of semiconductors. In this embodiment, first laser element 111 and second laser element 112 are laser elements manufactured to have the same main wavelength, and the main wavelength of laser light beams L oscillated by the laser elements is selected from a range from 400 nm to 490 nm (bluish purple to blue), inclusive, which is used for excitation light for obtaining white light. It should be noted that, in consideration of the combination with wavelength converter 104, ease of laser element manufacturing, etc., the wavelength of laser light beams L oscillated by the laser elements may be selected from a range from 440 nm to 470 nm, inclusive.

The light guides which include first light guide 121 and second light guide 122 are components which form optical paths so that the same area of wavelength converter 104 is irradiated with laser light beams L of the laser elements. In this embodiment, the light guides are what are called optical fibers which include a flexible core and cladding, and are components which, by making the refractive index of the core higher than the cladding, are able to retain laser light beams L inside the core by way of total reflection and thus guide laser light beams L efficiently. The core and the cladding are made of a material that is highly transmissive of laser light, such as silica glass, resin, etc.

It should be noted that the light guides may include a mirror, a lens, a prism, etc.

Base 103 is a component that holds wavelength converter 104 and holds the light guides so that the same area of wavelength converter 104 can be irradiated with the plurality of laser light beams L. In this embodiment, base 103 includes reflective surface 131 which reflects, toward a predetermined direction, the light radiated from wavelength converter 104.

Figure 2:
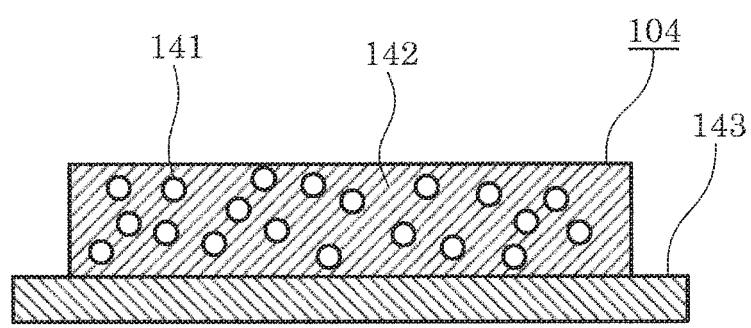
FIG. 2 is a cross-sectional view of a wavelength converter according to the embodiment.

FIG. 2 is a cross-sectional view of a wavelength converter.

Wavelength converter 104 is a component which wavelength-converts laser light beams L with which it is irradiated as excitation light, into visible light V having a different wavelength from laser light beams L, and includes wavelength converting material 141, sealant 142, and holding board 143.

Wavelength converting material 141 is a substance that radiates fluorescence with laser light beams L as excitation light. In this embodiment, wavelength converter 104 includes particles of a yellow phosphor which radiates yellow fluorescence due to blue laser light beams L. Specifically, the yellow phosphor can be exemplified by an yttrium aluminum garnet (YAG)-based phosphor.

It should be noted that wavelength converter 104 may include a plurality of wavelength converting materials 141. For example, wavelength converter 104 may include particles of a lutetium aluminum garnet (LAG)-based phosphor which is activated by cerium and emits green light, and particles of a SCASN-based phosphor represented by a (Sr, Ca) AlSiN3:Eu which emits red light.

In this embodiment, part of laser light beams L which are blue is wavelength-converted into yellow light by wavelength converting material 141 included in wavelength converter 104. Then, the blue light that is not absorbed by wavelength converting material 141 and the yellow light resulting from the wavelength-conversion by the yellow phosphor are diffused and mixed inside wavelength converter 104. With this, white light is emitted from wavelength converter 104.

Sealant 142 is a component capable of holding wavelength converting material 141 in a dispersed state and transmitting laser light beams L and the fluorescence radiated from wavelength converting material 141. The material of sealant 142 is not particularly limited and can be exemplified by for example an organic material such as a methyl-based silicone resin, an epoxy resin, a urea resin, or an inorganic material such as glass or ceramic, etc. In particular, when heat-resistance is required, an inorganic material is selected.

Holding board 143 is a structural component that can transmit laser light beams L and hold wavelength converter 104. The material of holding board 143 is not particularly limited and can be exemplified by aluminum oxide crystal or glass, etc.

It should be noted that, in this embodiment, a dichroic coat which transmits laser light beams L and reflects fluorescence radiated from wavelength converting material 141 is formed on one surface of holding board 143 in order to improve white light extraction efficiency, and base 142 containing wavelength converting material 141 is applied or printed, etc. above the dichroic coat to thereby form wavelength converter 104.

[Luminaire Manufacturing Method]

Figure 3:
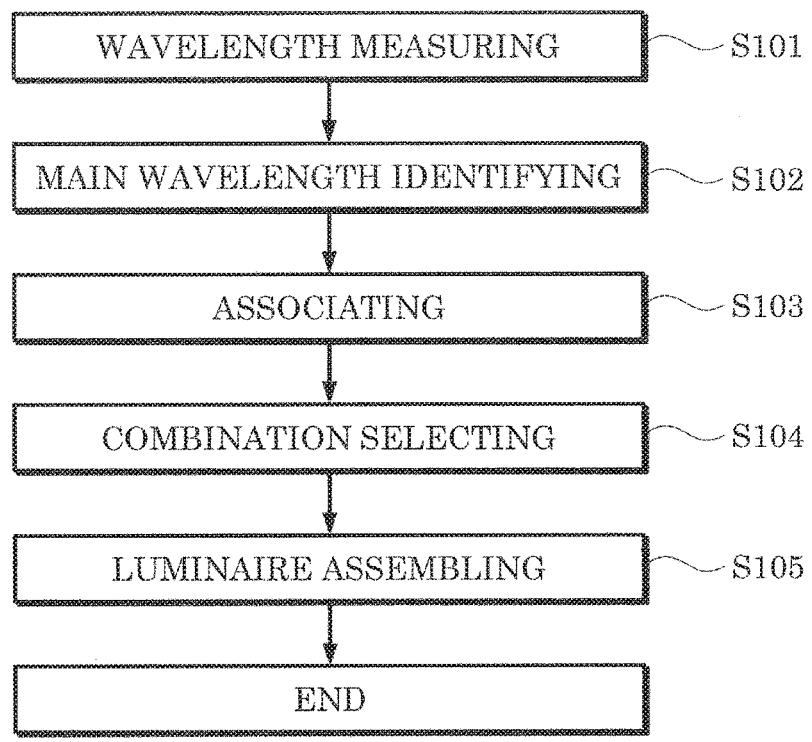
FIG. 3 is a diagram illustrating the flow of a process of manufacturing a luminaire according to the embodiment.

Next, the method of manufacturing luminaire 100 will be described,

FIG. 3 is a diagram illustrating the flow of a luminaire manufacturing process.

The wavelength of each of the laser light beams oscillated by the plurality of laser elements is measured (wavelength measuring: S101). These laser elements are manufactured so as to oscillate laser light beams having the same main wavelength. Specifically, for example, the laser elements are designed and manufactured to have a main wavelength of 455 nm. However, due to individual difference, the main wavelengths of the laser lights oscillated by the respective laser elements vary within a range of approximately ±20 nm, inclusive.

Figure 4:
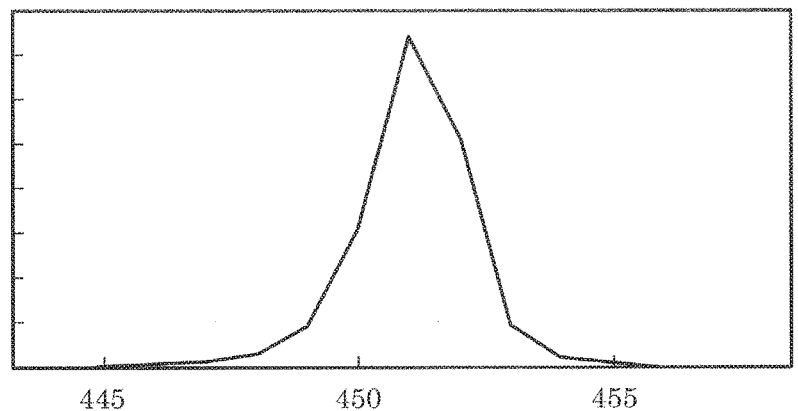
FIG. 4 is a graph illustrating a measurement result for laser light oscillated by one laser element.
Figure 5:
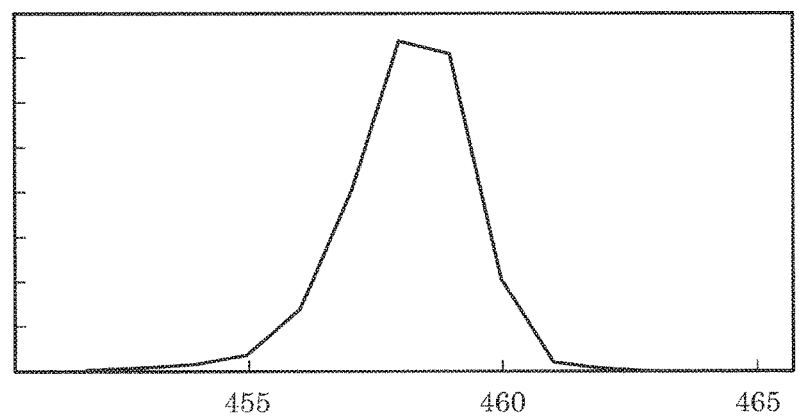
FIG. 5 is a graph illustrating a measurement result for laser light oscillated by another laser element.

FIG. 4 and FIG. 5 are graphs illustrating measurement results for laser light oscillated by different laser elements.

Next, the main wavelength is identified for each laser element based on the measurement result (main wavelength identifying: S102). Specifically, for example, the main wavelength is 450.9 nm in the case where the measurement result is the graph illustrated in FIG. 4, and the main wavelength is 458.2 nm in the case where the measurement result is the graph illustrated in FIG. 5.

The main wavelengths identified for the laser elements in the above manner are set as main wavelength information, and, as illustrated in FIG. 6, element information identifying the laser elements that are measured and the main wavelength information are stored in association with each other (an example of storing first association information) (associating: S103). The method of storing the associated element information and main wavelength information is not particularly limited and can be exemplified by a method which uses, for example, manufacturing management software, and stores the associated information as digital information in a memory.

Next, a combination of laser elements whose composite wavelength falls within a predetermined first range are selected based on the main wavelength information and element information which are stored in association with each other (i.e., selected based on the first association information) (combination selecting: S104).

Here, a composite wavelength is a value determined based on the respective main wavelengths of the selected laser elements, and is for example the average value of the main wavelengths when the output light intensities of the selected laser elements are the same. Alternatively, when the respective output light intensities of the selected laser elements are different, the center of gravity of the main wavelengths that are weighted according to the output light intensities may be used.

Furthermore, the first range may be a 3 nm range included in a range from 400 nm to 490 nm, inclusive. This is because, accordingly, most people see illumination in the same color under actual-use conditions of luminaires 100. In addition, the first range may be limited to a 2 nm range included in a range from 400 nm to 490 nm, inclusive. Accordingly, even when a plurality of luminaires 100 are compared in an experiment, the plurality of luminaires 100 are recognized as having approximately the same chromaticity.

In this embodiment, the first range is 455±1.5 nm, inclusive. In this case, for example, by selecting the laser elements of element information 002 and element information 038, the composite wavelength becomes (450.9 nm+458.2 nm)/2=454.55 nm and thus falls within the first range.

It should be noted that, when three or more laser elements are to be selected, the composite wavelength may be the average value of the main wavelengths of all the selected laser elements, or may be the average value of the maximum value and minimum value of such main wavelengths.

Furthermore, the laser elements to be selected may be selected from the laser elements whose main wavelengths fall within a range of ±10 nm, inclusive, from the median of the first range. This is because, when a laser element whose main wavelength falls outside the range of ±10 nm, inclusive, from the median is used, it s difficult to obtain a luminaire 100 having the desired color temperature even when the composite wavelength falls within the first range.

Next, luminaire 100 is assembled with optical paths being arranged using the light guides such that the same area of wavelength converter 104 is irradiated with the laser light beams oscillated by the selected laser elements.

In this embodiment, first laser element 111 and second laser element 112 are two laser elements that are selected and, as illustrated in FIG. 1, are connected to first light guide 121 and second light guide 121 which are optical fibers that are of the same type and length.

According to the above, it is possible to suppress individual difference-caused variation of luminous color of luminaire 100 which includes a plurality of laser elements, and thus it is possible to manufacture luminaire 100 which is stable.

Working Example

Next, the result of observing variation in luminaires 100 using a plurality of combinations of laser elements is illustrated.

For the laser elements, the following combinations were selected. The light output of the respective laser elements are all approximately the same.

A: (element information 073, main wavelength 448.4 nm), (element information 072, main wavelength 458.3 nm), composite wavelength 453.4 nm B: (element information 039, main wavelength 451.3 nm), (element information 076, main wavelength 458.0 nm), composite wavelength 454.7 nm C: (element information 001, main wavelength 448.3 nm), (element information 074, main wavelength 462.8 nm), composite wavelength 455.6 nm D: (element information 040, main wavelength 451.0 nm), (element information 075, main wavelength 462.4 nm), composite wavelength 456.7 nm Luminaires 100 of the same type and having a target color temperature of 3,500 K were manufactured using laser element combinations A, B, C, and D, respectively, and the color temperature of each luminaire 100 was measured.

Figure 7:
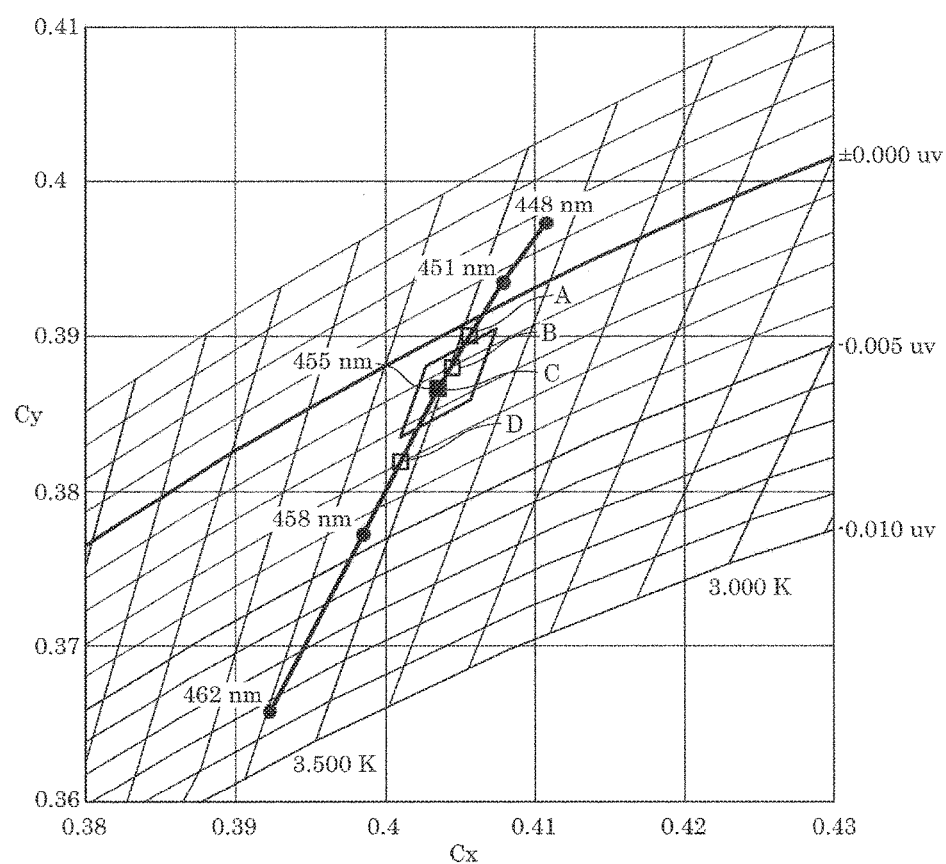
FIG. 7 is an xy chromaticity diagram illustrating luminaire chromaticity measurement results.

FIG. 7 is an xy chromaticity diagram illustrating luminaire color temperature measurement results.

In the figure, each value 448 nm, 451 nm, 455 nm, 458 nm, and 462 nm beside plots indicates the composite wavelength of two laser elements, and the corresponding plot represents the chromaticity result for luminaire 100 when the two laser elements are used. Furthermore, the inside of the bold-line parallelogram near the center in the figure indicates the target chromaticity range of luminaires 100. In this manner, laser element combinations B and C whose composite wavelengths fall within the range of 455±1.5 nm, inclusive, are within the target chromaticity range and have an acceptable chromaticity difference, that is, they are perceived by human eyes as having the same luminous color. In contrast, laser element combinations A and D have an unacceptable chromaticity difference, that is, they are perceived by human eyes as having luminous colors different from the luminous color of B and C.

As described above, by using laser element combinations in which the composite wavelength falls within the 3 nm range, it is possible to manufacture stable luminaires 100 which have no chromaticity variation and are capable of being perceived by human eyes as having the same luminous color.

In contrast, when laser elements are randomly combined, their composite wavelengths vary, for example, in a range from 448 nm to 462 nm, inclusive, and thus significantly go beyond the parallelogram in FIG. 7, and white chromaticity becomes significantly varied.

It should be noted that the present disclosure is not limited to the foregoing embodiment. For example, another embodiment realized by arbitrarily combining structural components or excluding some structural elements described in this written description may be included as an embodiment of the present disclosure. Furthermore, variations obtained by various modifications to the foregoing embodiment that can be conceived by a person having ordinary skill in the art, that are within the scope of the essence of the present disclosure, that is, the intended teachings of the recitations of the claims, are also included in the present disclosure.

For example, luminaire 100 may be manufactured by: measuring conversion characteristics of a plurality of wavelength converters 104 using a reference laser element; storing, in association with each other, (i) characteristic information each indicating one of the conversion characteristics measured and (ii) converter information each indicating one of the plurality of wavelength converters 104 measured (an example of storing second association information); and determining, based on the associated characteristic information and converter information (i.e., second association information), a combination including the combination of laser elements and one of the wavelength converters (target wavelength converter), such that the chromaticity of the light beam radiated by the one wavelength converter (target wavelength converter) based on the laser light beams of the combination of laser elements falls within a predetermined second range.

Figure 8:
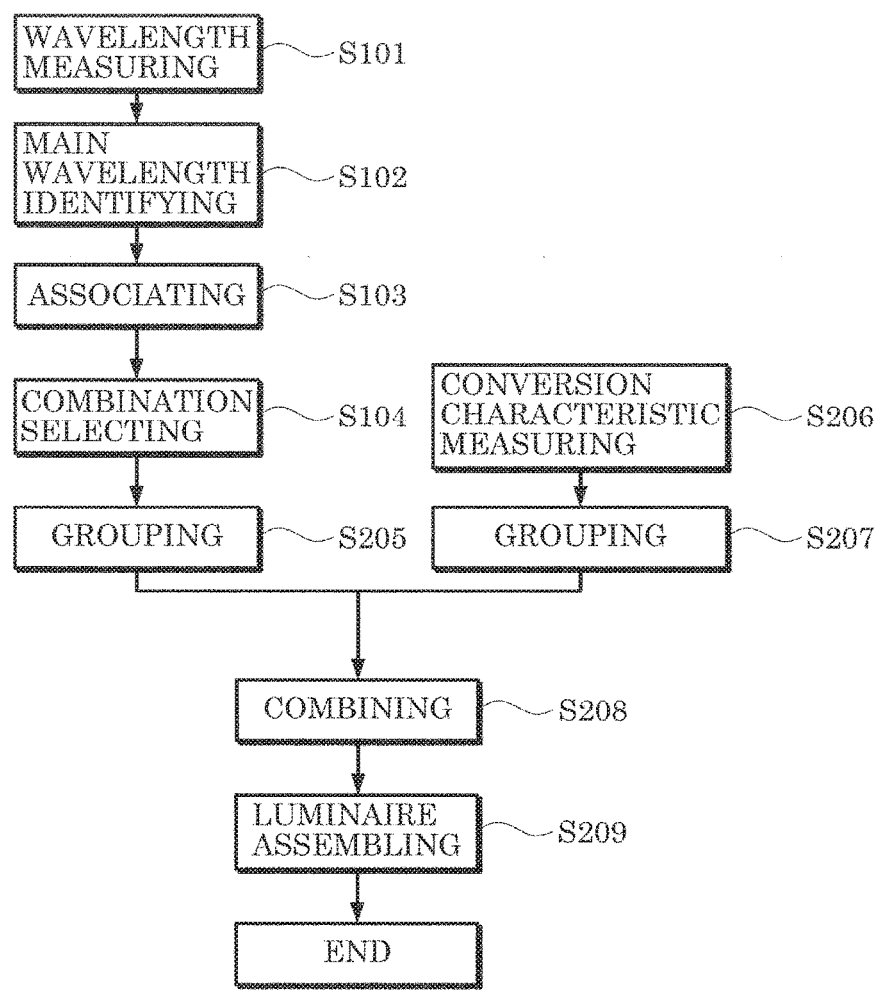
FIG. 8 is a diagram illustrating the flow of a process of manufacturing a luminaire according to a variation of the embodiment.

Specifically, for example, as illustrated in FIG. 8, the main wavelengths of laser elements are measured (S101 to S104), and a plurality of combinations of laser elements whose composite wavelengths fall within the 3 nm range (preferably within the 2 nm range) are classified into two groups: a long wavelength side and a short wavelength side (S205). Meanwhile, the conversion characteristics of a plurality of wavelength converters 104 are measured (S206), and the plurality of wavelength converters 104 are classified into the two groups: wavelength converters 104 having a low y chromaticity and wavelength converters 4 having a high y chromaticity (S207). Then, a combination of laser elements belonging to the long wavelength side group and one wavelength converter 104 belonging to the group with a high y chromaticity, or a combination of laser elements belonging to the short wavelength side group and one wavelength converter 104 belonging to the group with a low y chromaticity are combined (S208). Lastly, luminaire 100 is manufactured based on such combination (S209). Accordingly, it becomes possible to further reduce individual difference-caused variation of luminous color of luminaire 100.

Furthermore, the conversion characteristics of wavelength converters 104 may be measured based on the laser light beams which are guided by a plurality of light guides and with which the same area of wavelength converter 104 is irradiated. In other words, the conversion characteristics may be measured including the characteristics of the light guides.

Accordingly, individual difference-caused variation in chromaticity of luminaire 100 can further be suppressed.

Figure 9:
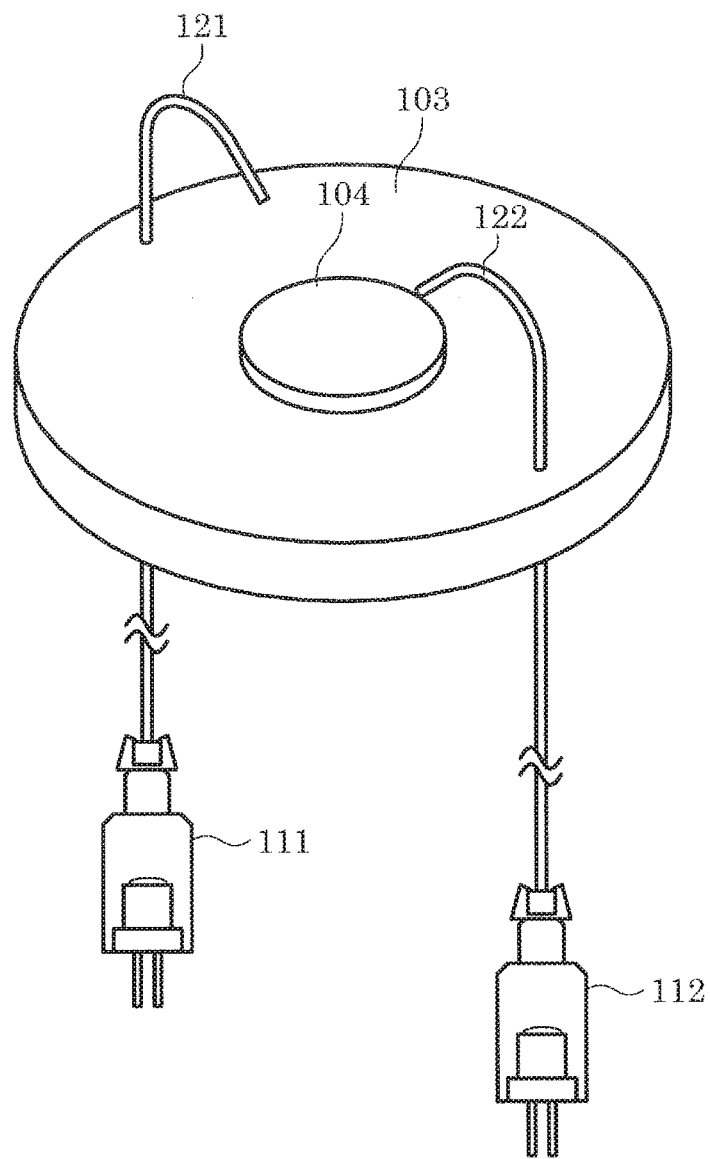
FIG. 9 is a diagram illustrating a configuration outline of a luminaire according to a variation of the embodiment.

Furthermore, aside from a transmission type luminaire 100 in which one surface of wavelength converter 104 is irradiated with laser light beams and white light is radiated from the opposite surface, luminaire 100 may be a reflective type luminaire 100 in which white light is radiated from the same surface of wavelength converter 104 which is irradiated with laser light beams, as illustrated in FIG. 9.

Furthermore, although it is described in the working example that the composite wavelength falls within the range of 455±1.5 nm, inclusive, the same advantageous effect can be obtained even with an arbitrary range such as 445±1.5 nm, 465±1.5 nm, etc.

Furthermore, the oscillation wavelength bands of the laser element having the longest main wavelength and the laser element having the shortest main wavelength, among the plurality of laser elements provided in one luminaire 100, need not overlap. Individually, the oscillation wavelength bands have, for example, a wavelength width of 1/10 of the peak. Accordingly, the laser element combination can be flexibly selected, and laser elements can be efficiently applied to luminaire 100.

Furthermore, the first range may be limited to a range that is further on the long wavelength side than the peak wavelength of the excitation spectrum of wavelength converter 104 or the excitation spectrum of at least one wavelength converting material 141 included in wavelength converter 104.

Furthermore, a light-transmissive cover may be disposed in front of wavelength converter 104. The cover may be a component which has glass, resin, etc., as a material, and serves to prevent foreign objects such as dust from settling on wavelength converter 104. In addition, the cover may have an optical function such as light diffusion, light collecting, etc.

What is claimed is:

1. A method of manufacturing a luminaire including a wavelength converter that radiates, based on a laser light beam oscillated by a laser element, a light beam having a wavelength different from a wavelength of the laser light beam, the method comprising:
   measuring wavelengths of a plurality of laser light beams oscillated by a plurality of laser elements to identify main wavelengths of the plurality of laser elements;
   storing first association information indicating associations between main wavelength information and element information, the main wavelength information indicating the main wavelengths identified, the element information identifying the plurality of laser elements corresponding to the main wavelengths identified;
   selecting, from the plurality of laser elements and based on the first association information, a combination of laser elements having a composite wavelength being within a predetermined first range;
   measuring conversion characteristics of each of a plurality of wavelength converters, based on laser light beams which are guided by a plurality of optical fibers connected to the plurality of laser elements and with which a same area of the wavelength converter is to be irradiated;
   storing second association information indicating associations between characteristic information, converter information, and optical fiber information, the characteristic information indicating the conversion characteristics measured, the converter information identifying the plurality of wavelength converters corresponding to the conversion characteristics measured, the optical fiber information identifying the plurality of optical fibers;
   determining, based on the second association information, a combination including the combination of laser elements, a target wavelength converter out of the plurality of wavelength converters, and a combination of optical fibers out of the plurality of optical fibers, by which chromaticity of a light beam radiated through the target wavelength converter based on the laser light beams of the combination of laser elements is within a predetermined second range; and
   arranging the combination of optical fibers to irradiate the same area of the target wavelength converter with the laser light beams of the combination of laser elements selected.

2. The method of manufacturing the luminaire according to claim 1, wherein
   the predetermined first range is a 3 nm range included within a range from 400 nm to 490 nm, inclusive.

3. The method of manufacturing the luminaire according to claim 1, wherein
   each of the laser light beams of the first combination of laser elements selected is transmitted through the target wavelength converter.

4. The method of manufacturing the luminaire according to claim 1, wherein
   the target wavelength converter is selected in view of the combination of laser elements selected.

5. The method of manufacturing the luminaire according to claim 1, wherein
chromaticity of a first part of the laser light beams of the combination of laser elements selected is modified when radiated through the target wavelength converter.

6. The method of manufacturing the luminaire according to claim 5, wherein
the chromaticity of the first part of the laser light beams of the combination of laser elements selected, which is modified is combined with chromaticity of a second part of the laser light beams of the combination of laser elements selected that is unmodified when radiated through the target wavelength converter, to provide a combined chromaticity being within the predetermined second range.

7. A method of manufacturing a luminaire including a wavelength converter, the method comprising:
obtaining main wavelength information of a plurality of laser elements;
selecting, from the plurality of laser elements, a combination of laser elements having a composite wavelength being within a predetermined range in view of the main wavelength information;
obtaining conversion characteristics of each of a plurality of wavelength converters, based on laser light beams which are guided by a plurality of optical fibers connected to the plurality of laser elements and with which a same area of the wavelength converter is to be irradiated;
determining a combination including the combination of laser elements selected, a target wavelength converter out of the plurality of wavelength converters, and a combination of optical fibers out of the plurality of optical fibers, by which chromaticity of a light beam radiated through the target wavelength converter based on the laser light beams of the combination of laser elements selected is within a predetermined second range; and
arranging the combination of optical fibers to irradiate the same area of the target wavelength converter with the laser light beams of the combination of laser elements selected.

* * * * *